United States Patent [19]

Lou

[11] Patent Number: 4,628,215

[45] Date of Patent: Dec. 9, 1986

[54] DRIVE CIRCUIT FOR SUBSTRATE PUMP

[75] Inventor: Perry W. Lou, Sugar Land, Tex.

[73] Assignee: Texas Instruments Incorporated, Dallas, Tex.

[21] Appl. No.: 651,140

[22] Filed: Sep. 17, 1984

[51] Int. Cl.[4] .......................... H03L 1/00; G05F 3/24; H03K 17/693

[52] U.S. Cl. ................................ 307/297; 307/296 A; 307/304

[58] Field of Search ........... 307/200 B, 296 R, 296 A, 307/297, 304; 363/59, 60

[56] References Cited

U.S. PATENT DOCUMENTS

| | | | |
|---|---|---|---|
| 4,259,686 | 3/1981 | Suzuki et al. | 307/296 A X |
| 4,307,333 | 12/1981 | Hargrove | 307/304 X |
| 4,322,675 | 3/1982 | Lee et al. | 307/297 X |
| 4,455,628 | 6/1984 | Ozaki et al. | 307/296 A X |
| 4,460,835 | 7/1984 | Masuoka | 307/296 R |
| 4,494,223 | 1/1985 | Reddy et al. | 307/297 X |
| 4,553,047 | 11/1985 | Dillinger et al. | 307/304 X |

FOREIGN PATENT DOCUMENTS

| | | | |
|---|---|---|---|
| 121561 | 10/1978 | Japan | 307/296 R |
| 25220 | 2/1980 | Japan | 307/296 R |
| 90139 | 7/1980 | Japan | 307/296 A |

OTHER PUBLICATIONS

Lee et al, "A 80 ns 5 V-Only Dynamic RAM"; IEEE-ISSCC, 1979, Digest of Technical Papers, pp. 142-143.

*Primary Examiner*—Larry N. Anagnos

*Attorney, Agent, or Firm*—Rodney M. Anderson; John G. Graham

[57] ABSTRACT

A substrate pump circuit for generating a negative bias on the substrate of a semiconductor device employs a capacitor coupling an oscillator output to a pump node, and MOS diodes coupling the pump node to a ground terminal and to the substrate node; the MOS diode for the substrate node is reconfigured as an active switch, controlled by a complementary pump circuit. This circuit allows transfer of more charge from the pumping capacitor to the substrate capacitance on each pump cycle. Also, pumped charge is delivered directly to the substrate through ohmic connections, rather than through forward biased injecting junctions.

8 Claims, 4 Drawing Figures

DRIVE CIRCUIT FOR SUBSTRATE PUMP

BACKGROUND OF THE INVENTION

This invention relates to semiconductor devices, and more particularly to substrate bias generator circuits for VLSI semiconductor integrated circuits such as microprocessor or memory devices or the like.

Substrate bias generator circuits for MOS LSI devices have been constructed as shown for example in U.S. Pat. No. 4,115,710, issued to Perry W. Lou, or application Ser. No. 418,899, filed Sept. 12, 1982 by G. R. M. Rao and C. N. Reddy, now U.S. Pat. No. 4,494,223 assigned to Texas Instruments. The very high density devices such as high-level microprocessors or dynamic RAMs now being designed have more stringent requirements, however. The regulation, and power dissipation during both operating and standby modes, are more critical.

It is the principal object of this invention to provide an improved substrate bias generator circuit for a semiconductor device such as microprocessor. Another object is to provide a charge pump circuit that is more efficient and operates faster. Another object is to provide a substrate bias generator that reduces operating and standby power dissipation.

SUMMARY OF THE INVENTION

In accordance with one embodiment of the invention, a substrate pump circuit for generating a negative bias on the substrate of a semiconductor device employs a capacitor coupling an oscillator output to a pump node, and MOS diodes coupling the pump node to a ground terminal and to the substrate node; the MOS diode for the substrate node is reconfigured as an active switch, controlled by a complementary pump circuit. This circuit allows transfer of more charge from the pumping capacitor to the substrate capacitance on each pump cycle. Also, pumped charge is delivered directly to the substrate through ohmic connections, rather than through forward biased injecting junctions.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
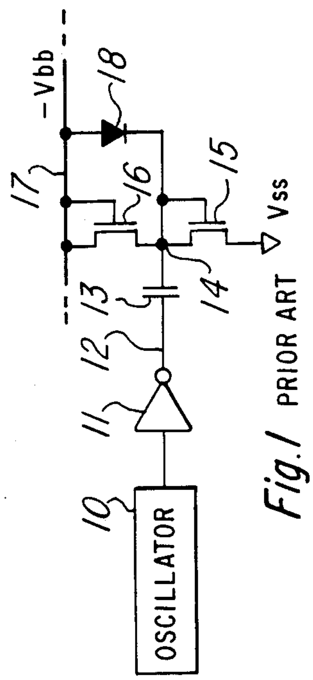
Fig.1 PRIOR ART
FIG. 1 is an electrical schematic diagram of a substrate pump circuit according to the prior art.

Substrate voltage generators or pump circuits are simple voltage doubler circuits, usually using MOS transistors instead of bipolar diodes. In the typical pump circuit of FIG. 1, a oscillator 10 produces an input at a selected frequency to a driver circuit 11, so the output node 12 of this driver is alternately forced to +Vdd and ground. A pump capacitor 13 connected to node 14 attempts to force the node 14 high on the on-going edge of the driver output, and low on the zero-going edge. But the transistor 15 connected with gate shorted to source acts as a diode, i.e., conducts unidirectionally and doesn't let the node 14 go positive on the one-going edge. On the zero-going edge the capacitor 13 tries to pull the node 14 to a negative level, and the transistor 16 (connected as a diode) can conduct from the substrate. The substrate 17, if more positive than node 14 at this point, conducts through transistor 16, so the substrate is pumped to a negative voltage −Vbb. The junction diode 18 represents the junction between the source/-drain N+ diffusion on node 14 and the P type substrate 17, (polarity indicated for N-channel MOS processing). When the driver output 12 goes high, the capacitor 13 gets precharged to Vdd-Vt1 since transistor 15 clamps node 14 to a voltage approximately equal to the threshold voltage Vt1 of transistor 15. When node 12 goes low for the pump stroke, the MOS diode formed by transistor 15 turns off so that node 14 also goes low. When node 14 gets sufficiently more negative than the voltage at substrate 17, the MOS diode formed by transistor 16 and/or junction diode 18 begin conducting so that charge is transferred from the capacitor 13 to the substrate 17 capacitance Css. The most negative voltage −Vbb that the substrate can be pumped to is either −(Vdd−Vt1−Vt2) or −(Vdd−Vt1−Vd1) where Vt1 is the threshold voltage of transistor 15 including body effect, Vt2 is the threshold voltage of transistor 16 at Vbs−0 (not body effect), and Vd1 is the forward diode drop of diode 18.

In some N-channel processes, an unimplanted or "natural" transistor can be used as the transistor 16, when the natural threshold voltage is near zero, and is always positive. Then the transistor 16 can be made large enough to conduct the majority of the pumped charge transfer instead of diode 18. If the natural threshold is sometimes negative, then transistor 16 may be used if a threshold adjusting implant is used to guarantee a positive threshold voltage. However, if the adjusted threshold is above Vd1, then the diode 18 will conduct the majority of charge and transistor 16 would not be required.

It is generally undesirable to conduct the pumped charge through the diode 18, however, as this is a localized injection of charge at the silicon surface. In high resistivity substrates, the injected charge can travel a significant distance across the chip, with resulting reliability problems for dynamic storage nodes.

Figure 2:
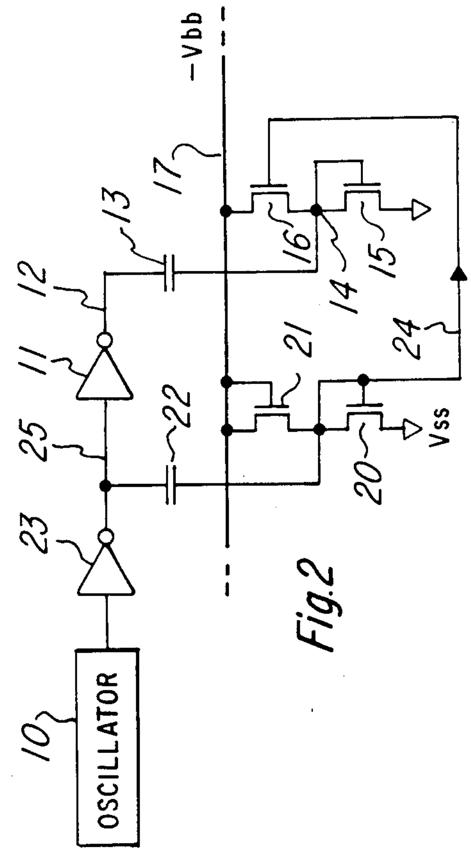
FIG. 2 is an electrical schematic diagram of a substrate pump circuit constructed according to the invention.

With reference to FIG. 2, improved circuit of the invention uses a complementary pump and reconfigures the transistor 16 as an active switch. The basic circuit is shown here with junction diodes omitted for simplicity. The complementary pump stage consisting of transistors 20 and 21, a pump capacitor 22, and a drive stage 23 is shown configured as the conventional pump stage of FIG. 1, except that the pump node 24 also gates the transistor 16 in the modified stage. Assume that the first stage output 25 is low, and that node 24 is at V3=−(Vdd−Vt3−Vt4). The second stage output node 12 is then high, and node 14 is at Vt1. If the substrate voltage, Vbb is at the maximum which it can be pumped by the first stage 11, then Vbb=−(Vdd−Vt3−Vt4)=V3. Therefore for transistor 16, the gate voltage Vg=V3=Vs=Vbb so transistor 16 is cutoff. Then, on the alternate half-cycle, node 25 goes to Vdd, and node 24 goes towards +Vt3. Transistor 16 then begins conducting slightly before the second stage 11 output at node 12 begins going low. For this short time until node 12 goes low, some substrate charge is transferred to node 14, causing the voltage on node 14 to fall, turning off MOS diode 15 (if it is not already off). This substrate charge is not lost, but is returned to the substrate when node 12 goes low, driving node 14 low. Since transistor 16 maintains a good gate drive during the pump stroke, the full precharge voltage (Vdd–Vt1) can be transferred to the substrate 17 corresponding to the case when Vds=0 for transistor 16. The maximum value of substrate voltage −Vbb which can eventually be pumped is now (Vdd–Vt1), an improvement of −Vt2 over the conventional circuit of FIG. 1. Note that when −Vbb is approaching equal to −(Vdd−Vt1), the transistor 16 will still be driven into cutoff on initial half-cycles (node 25 low) since node 24 will fall to −(Vdd−Vt3)≈Vbb because MOS diode 21 (or junction diode on node 24) will not become forward biased.

The advantages are more efficient use of a given pump capacitor size, and avoidance of diode injection completely, if switch transistor 16 conducts sufficiently to avoid forward biasing the junction diode 18.

Although the circuit of FIG. 2 illustrates the concept of the invention, the preferred embodiment is in a combined ring-oscillator/distributed pump system disclosed in my copending application Ser. No. 651,401, filed herewith, and shown in FIG. 3. In this circuit a ring oscillator is used, consisting of an odd number of inverter stages 11, with the output 12 of each inverter used to drive a pump circuit through a capacitor 13. A feedback path 28 connects the output of the last stage to the input of the first, so the circuit will oscillate (i.e., each node 12 will switch states) at a rate dependent upon the RC delays. Each capacitor 13 is coupled to a pump node 14 as above, and each node 14 is coupled to the ground terminal Vss by transistor 15 connected as an MOS diode; each node 14 is coupled to the −Vbb substrate 17 by a transistor 16 which has its gate driven from node 14 of the prior stage, just like the circuit of FIG. 2, and so operation is the same as FIG. 2.

A disadvantage of the basic circuit of FIG. 2 is that the additional complementary phase stage 23 is required, yet the additional stage 23 ceases to supply charge to the substrate when Vbb is more negative than −(Vdd−Vt3−Vt4), thus raising the effective output impedance of the pump. This disadvantage is avoided if a substrate voltage regulation scheme is employed with the regulated voltage |Vb|<|(Vdd−Vt3−Vt4)|. The disadvantage is also avoided in the combined ring-oscillator/distributed pump system of FIG. 3, since every stage is modified to use the MOS switch. A slight sacrifice is made to pump efficiency since a small portion of charge from the pump capacitor is removed to turn-off the switch and is therefore not available to the substrate. This switch transistor's gate capacitance is usually an order of magnitude less than the pump capacitor size. The sacrifice is, of course, off-set by the extra voltage available to charge the substrate.

The concept of the invention is adaptable to any P-channel or N-channel MOS substrate charge pump, or CMOS, and may be used in conjunction with other known charge pump improvements such as tripling, substrate voltage regulation techniques, and, as mentioned, integrated ring-oscillator/pump configurations.

Figure 4:
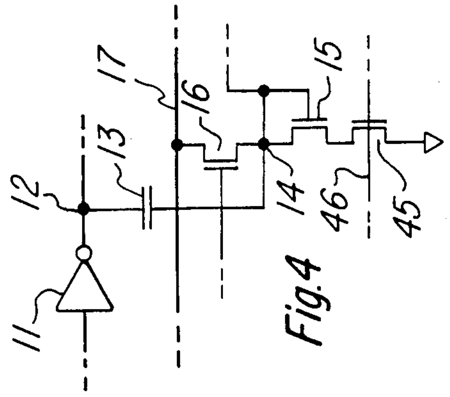
FIG. 4 is an electrical schematic diagram of a substrate pump circuit according to yet another embodiment of the invention.
Figure 3:
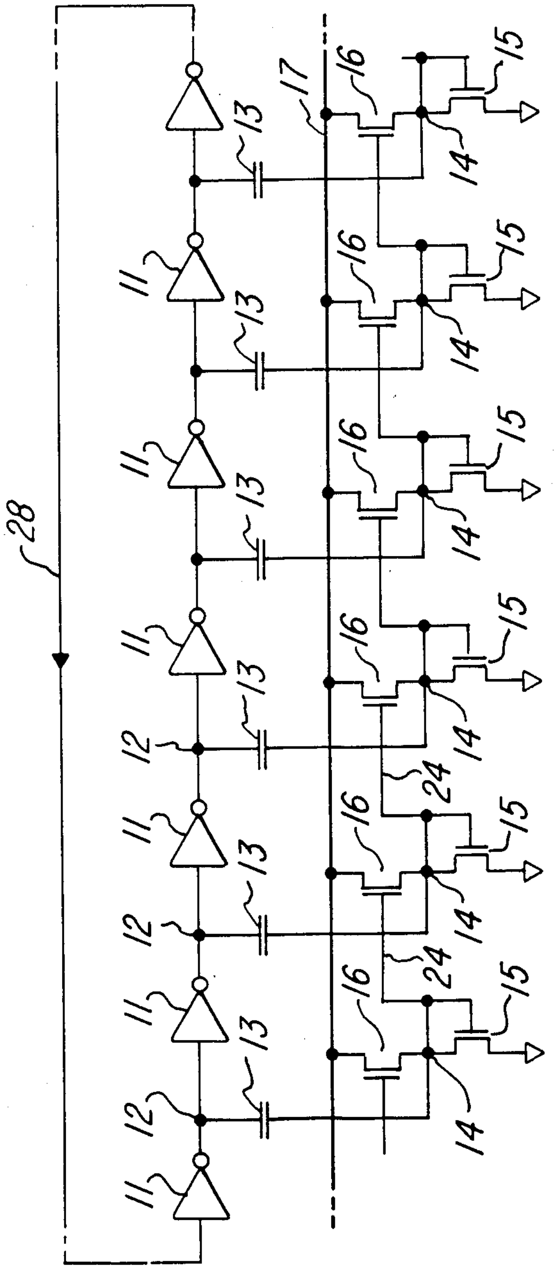
FIG. 3 is an electrical schematic diagram of a multistage oscillator and pump circuit according to another embodiment of the invention.

For example, as illustrated in FIG. 4, each pump stage of the circuit of FIG. 3 may include an additional transistor 45 for varying the resistance of the path from node 14 to Vss through the transistor 15, in response to the voltage on the substrate 17. This circuitry is shown in my application Ser. No. 651,401, filed herewith. As the substrate voltage approaches the desired value −Vbb, the control line 46 goes from high to low, increasing the resistance of the transistor 45 for each stage, increasing the charging time constant for capacitor 13.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

I claim:

1. A substrate pump circuit for a semiconductor chip, comprising:

first and second driver circuits, each having an input and an output, the output of the first being connected to the input of the second, first and second pump capacitors connecting the outputs of the first and second driver circuits to first and second pump nodes, respectively, first and second clamp transistors, said clamp transistors each having a gate, a drain and a source, said clamp transistors each having its gate shorted to its source, the source of said first and second clamp transistors connected to said first and second pump nodes, respectively, said clamp transistors each having its drain connected to electrical ground, first and second pump transistors, said pump transistors each having a gate and a source-to-drain path, the source-to-drain path of said first and second pump transistors connected between the substrate of said chip and said first and second pump nodes, respectively, the second pump transistor having its gate connected to said first pump node, and means for biasing the gate of said first pump transistor so that said source-to-drain path of said first transistor is non-conductive during such time as the voltage of said first pump node causes the source-to-drain path of said first clamp transistor to be conductive.

2. A circuit according to claim 1 wherein said biasing means comprises means for connecting the gate of said first pump transistor to said substrate.

3. A circuit according to claim 1 wherein said first and second driver circuits are in a ring oscillator circuit.

4. A circuit according to claim 3 wherein said biasing means comprises means for coupling the gate of said first pump transistor to a pump node in a prior stage of said ring oscillator.

5. A circuit according to claim 4 including a regulating transistor having a source-to-drain path in series with each said clamp transistor, each regulating transistor having a gate connected to a voltage varying in response to the bias of the substrate of said chip.

6. A substrate pump circuit for a semiconductor chip, comprising:

a plurality of inverters, each inverter having an input and an output, the output of each of said inverters connected to the input of another of said inverters;

a plurality of drive circuits, each drive circuit associated with one of said inverters, and each drive circuit comprising:

a pump node, a capacitor connected between said pump node and the output of the inverter stage associated with said drive circuit, a first transistor having a source-to-drain path coupling said pump node to a ground terminal and having a gate connected to said pump node, and a second transistor having a source-to-drain path coupling said pump node to the substrate of said chip, and having a gate connected to the pump node of another of said drive circuits.

7. A circuit according to claim 6 wherein each of said drive circuits includes a regulating transistor having a source-to-drain path in series with said first transistor, each regulating transistor having a gate connected to a voltage varying in response to the voltage on said substrate.

8. A circuit according to claim 6 wherein said plurality of inverters are connected as a ring oscillator.

* * * * *